United States Patent [19]
Sezi et al.

[11] Patent Number: 5,973,202
[45] Date of Patent: *Oct. 26, 1999

[54] PREPARATION OF POLY-O-HYDROXYAMIDES AND POLY O-MERCAPTOAMIDES

[75] Inventors: Recai Sezi; Hellmut Ahne, both of Röttenbach; Eva Rissel, Forchheim; Kurt Geibel, Hessdorf, all of Germany

[73] Assignee: Siemens Aktiengesellschaft, München, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 08/704,064

[22] Filed: Aug. 28, 1996

[30] Foreign Application Priority Data

Aug. 31, 1995 [DE] Germany .............. 195 32 176

[51] Int. Cl.$^6$ .............. C07C 231/02; C08G 63/00
[52] U.S. Cl. .............. 564/134; 564/133; 564/135; 564/136; 564/139; 564/140; 528/183; 528/184; 528/335; 528/338; 528/339
[58] Field of Search .............. 564/133, 134, 564/135, 136, 139, 140; 528/183, 184, 335, 338, 339

[56] References Cited

U.S. PATENT DOCUMENTS

| | | | |
|---|---|---|---|
| 4,331,592 | 5/1982 | Wissmann et al. | 530/342 |
| 4,339,521 | 7/1982 | Ahne et al. | 430/192 |
| 4,622,285 | 11/1986 | Ahne | 430/322 |
| 4,849,051 | 7/1989 | Ahne et al. | 156/659.1 |
| 5,021,320 | 6/1991 | Mueller et al. | 430/192 |
| 5,037,720 | 8/1991 | Khanna | 430/190 |
| 5,096,999 | 3/1992 | Hellmut et al. | 528/182 |
| 5,194,568 | 3/1993 | Gregory et al. | 528/184 |
| 5,219,981 | 6/1993 | Gregory et al. | 528/377 |

FOREIGN PATENT DOCUMENTS

| | | | |
|---|---|---|---|
| 0652170 | 8/1994 | Australia | 564/134 |
| 1393740 | 5/1975 | United Kingdom . | |
| 2 188 936 | 10/1987 | United Kingdom . | |

OTHER PUBLICATIONS

Labadie, et al., "Recent Advances In High Temperature Polymers For Microelectronic Applications," *SAMPE Journal*, vol. 25, No. 6, Nov./Dec. 1989 pp. 18–23.

Soane, David S. et al., "Polymers in Microelectronics Fundamentals and Applications," *Elesevier*, 1989, pp. 77–124.

Rutter, Edward W., et al. "A Photodefinable Benzocyclobutene Resin For Thin Film Microelectronic Applications," *Proceedings of the 1992 International Conference On Multichip Modules*, Apr. 1–3, 1992, pp. 394–400.

Mercer F. W., "Aromatic Polyther imide oxadiazole)s," *High Performance Polymers*, vol. 4, No. 2, 1992 pp. 73–80.

Ahne, Hellmut, "Recent Advances in Photosensitive Polyamides," *Polymers for Advanced Technologies*, vol. 4, Oct. 1992, pp. 217–233.

*Primary Examiner*—Shailendra Kumar
*Attorney, Agent, or Firm*—Kenyon & Kenyon

[57] ABSTRACT

In a process for the preparation of poly-o-hydroxyamides and poly-o-mercaptoamides, a bis-o-aminophenol or a bis-o-aminothiophenol is reacted with a dicarboxylic acid derivative of the following structure:

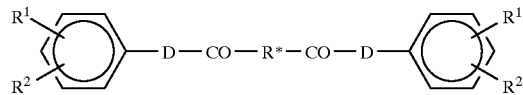

with D=O, S, or NH
and where R* is the parent body of the dicarboxylic acid and at least one of the groups $R^1$ and $R^2$ is CN or $NO_2$.

10 Claims, No Drawings

PREPARATION OF POLY-O-HYDROXYAMIDES AND POLY O-MERCAPTOAMIDES

FIELD OF THE INVENTION

The invention relates to a process for the preparation of poly-o-hydroxyamides (polybenzoxazole precursors) and poly-o-mercaptoamides (polybenzothiazole precursors).

BACKGROUND OF THE INVENTION

Highly thermoresistant polymers are required in microelectronics, particularly as protective and insulating coatings and as dielectrics (see, for example, "SAMPE Journal" 25, No. 6, pp. 18–23 (1989) and "Proceedings of the 1992 International Conference on Multichip Modules", pp. 394–400). Some of the polymers used, such as homo- and copolymers of aromatic polyethers and precursors of polyimides (PI) and polybenzoxazoles (PBO) show a good solubility in organic solvents and good film-forming properties and can be applied to electronic components by means of spin-coating technology (see, for example, "High Performance Polymers" 4, No. 2, pp. 73–80 (1992) and "Polymers for Advanced Technologies" 4, pp. 217–233 (1993).

By means of a temperature treatment, polymer precursors of the above-mentioned type are cyclized, i.e., converted to the corresponding polymers (PI or PBO); this results in the final properties. This is because, as a result of the cyclization, the hydrophilic groups of the poly-o-hydroxyamide disappear, i.e., the NH, OH, and CO groups, which would have a negative effect on the dielectric properties and the water absorption. This is, for example, a significant advantage of the polybenzoxazoles as compared with the polyimides (with two CO groups per imide unit) and, in particular, as compared with the hydroxypolyimides (with two CO groups and one OH group per imide unit). In addition, the cyclization is important not only for the good dielectric properties and the low water absorption of the end product but also for its high temperature stability.

PI and PBO precursors can, for example, be adjusted photosensitively by the addition of suitable photoactive components and can then be structured directly, i.e., without the use of an auxiliary resist. This is important for the reason that direct structuring—as compared with indirect structuring—offers considerable cost advantages.

In contrast to most photosensitive PI precursors, photosensitive PBO precursors offer the advantages of a positive structurability, such as a lower defect density in the structuring of the so-called "via holes", because—in comparison with negative operating systems—only a fraction of the surface is exposed to light. The use of alkali-soluble PBO precursors also results in the possibility of an aqueous alkaline development. After the photostructuring, the cyclization of the precursors is then carried out by annealing.

PBO precursors that can be developed in aqueous alkaline medium are already known (see European Patent 0 023 662, European Application 0 264 678, and European Patent 0 291 779). The photolithographic process used, except for the cyclization, is the same as in the structuring of known positive resists based on novolaks and quinone azides, a process that is used in numerous production lines worldwide (see, for example, D. S. Soane and Z. Martynenko: "Polymers in Micro-electronics—Fundamentals and Applications", Elsevier, Amsterdam (1989), pp. 77–124).

The solubility of the PBO precursors in alkalies is an important requirement for their use as base polymers for photosensitive dielectrics that can be developed in aqueous alkalies. For microelectronic uses, the precursors must be soluble in developers free of metal ions, so that developers of this type can also be used in the photostructuring. This is because developers containing metal ions can have a negative effect on the electrical operation of the components.

The most common method for the preparation of alkali-soluble PBO precursors, i.e., of poly-o-hydroxyamides, is the reaction of a dicarboxylic acid chloride with a suitable bis-o-aminophenol. To capture the hydrogen chloride formed in the reaction, a soluble base, such as pyridine, is added, as a rule (see European Application 0 264 678 and European Patent 0 291 779). Although it is possible, by means of this method, to prepare precursors that are soluble in aqueous alkaline developers free of metal ions, there is the disadvantage that chloride ions remain in the polymer. However, a polymer of this type can not be used as a coating material for microelectronic components, because the chloride ions cause corrosion and can thus strongly impair the operation of the components. A purification of the polymer by means of ion exchangers is therefore required. However, this purification is time-consuming and expensive, as it includes additional process stages, such as the preparation of the ion-exchange column, dissolution of the polymer, passage of the solution through the column and rewashing, and repetition of the precipitation and drying.

In the preparation of poly-o-hydroxyamides, it is also necessary to meet the requirement that the dicarboxylic acid chloride react predominantly with the amino groups of the bis-o-aminophenol (with amide formation), but not with its hydroxy groups (with ester formation), i.e., the reaction selectivity of the amide formation must be high as compared with that of the ester formation. If the ester formation can not be excluded or strongly suppressed, then this will lead to insufficiently alkali-soluble polymers. A low reaction selectivity can also lead to a gel formation in the polymer solution, as a result of which the poly-o-hydroxyamide produced then becomes unfilterable and thus useless.

Processes for the chloride-free synthesis of poly-o-hydroxyamides—and also of poly-o-mercaptoamides—have also already been described. Thus, it is known, from European Application 0 158 726, to react dihydroxy- and dimercaptodiamino compounds with a dicarboxylic acid in the presence of a carbodiimide. However, in this reaction, urea residues remaining on the resin as a result of a rearrangement reaction frequently present problems. This is because they reduce the thermal stability of the polybenzoxazole or polybenzothiazole and the quality of the coatings prepared from these. In addition, the polymers produced by this process are not sufficiently soluble in aqueous alkaline developers free of metal ions.

An alternative chloride-free production process for poly-o-hydroxyamides consists of using condensation reagents, such as 1-ethoxycarbonyl-2-ethoxy- 1,2-dihydroquinoline and 1,1'-carbonyldioxydi-1,2,3-benzotriazole (see European Application 0 391 196) for the reaction of the dicarboxylic acid with the bis-o-aminophenol. However, the polymers produced in this manner also show an insufficient solubility in aqueous alkaline developers free of metal ions.

Processes are also known in which the amide formation takes place by means of phosphorus compounds (see: European Application 0 481 402, U.S. Pat. No. 4,331,592, and German Application OLS 3,716,629). However, in the case of poly-o-hydroxyamides, syntheses of this type lead either to cyclized, i.e. alkali-insoluble, products, or phosphorus-containing, in part also chemically bonded, residues remain in the polymer, as a result of which the polymer, because of the doping properties of phosphorus, becomes unusable for microelectronic applications. This is because, in contrast to ionic impurities, residues of this type can not be removed, e.g., by means of ion exchangers.

SUMMARY OF THE INVENTION

It is the object of the invention to indicate an economical process by means of which—in a chloride-free manner—poly-o-hydroxyamides and poly-o-mercaptoamides that are soluble in aqueous alkaline developers free of metal ions can be prepared.

According to the invention, this is achieved by reacting a bis-o-aminophenol or a bis-o-aminothiophenol with a dicarboxylic acid derivative of the following structure:

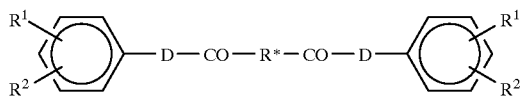

where D=O, S, or NH;

R$^1$ and R$^2$ are, independently of each other, H, F, CH$_3$, CF$_3$, CN, or NO$_2$, where at least one of the groups R$^1$ and R$^2$ is CN or NO$_2$;

R* has the following meaning:
—(CR$_2$)$_m$, with R=H, F, CH$_3$, or CF$_3$
and m=1 to 10;

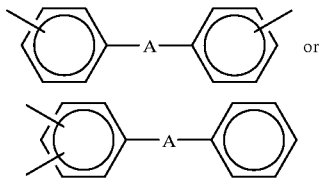

with A=(CH$_2$)$_n$, (CF$_2$)$_p$, C(CH$_3$)$_2$, C(CF$_3$)$_2$, C(CH$_3$)(C$_6$H$_5$), C(CF$_3$)(C$_6$H$_5$), C(CF$_3$)(C$_6$F$_5$), C(C$_6$H$_5$)$_2$, CF$_2$—CF(CF$_3$), CH=CH, CF=CF, C≡C, O—C$_6$H$_4$—O, O, S, CO, or SO$_2$, where n=0 to 10 and p=1 to 10;

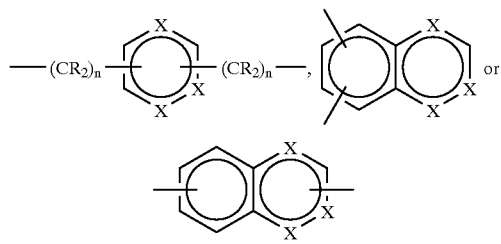

with X=CH or N,
R=H, F, CH$_3$, or CF$_3$, and n=0 to 10;

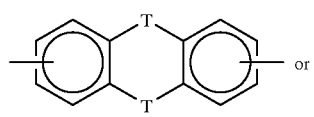

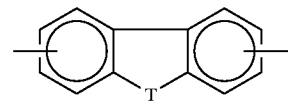

with T=CH$_2$, CF$_2$, CO, O, S, NH, or N(CH$_3$);

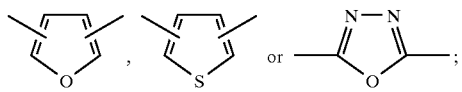

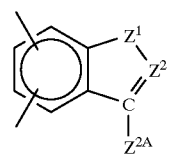

with
(a) Z$^1$=CH$_2$ or CH(CH$_3$) and Z$^2$=CH or C(CH$_3$)
(b) Z$^1$=CH$_2$ or CH(CH$_3$) and Z$^2$=N
(c) Z$^1$=NH or N(CH$_3$) and Z$^2$=CH or C(CH$_3$)
(d) Z$^1$=NH or N(CH$_3$) and Z$^2$=N
(e) Z$^{2A}$=H or CH$_3$;

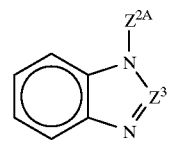

with
(a) Z$^3$=CH or C(CH$_3$)
(b) Z$^3$=N

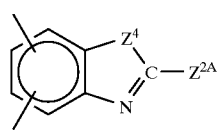

with
(a) Z$^4$=O
(b) Z$^4$=S, where, in each case, all hydrogen atoms (H) in all aromatic partial structures can be replaced by fluorine (F).

The invention solves the problem described above by using as the dicarboxylic acid component special dicarboxylic acid derivatives, namely esters containing nitro and/or cyano groups with phenols or corresponding thioesters and amides. Surprisingly, this results in an adequate selectivity of the amide formation. This is because the polymers prepared according to the invention, i.e., the poly-o-hydroxyamides and poly-o-mercaptoamides, are soluble in aqueous alkaline developers free of metal ions. In addition, the process according to the invention takes place without gel formation, so that the above-mentioned polymers are readily soluble and processable in organic solvents. Also, impurities such as chloride and metal ions and phosphorus compounds are avoided in this process.

DETAILED DESCRIPTION OF THE INVENTION

Special compounds from dicarboxylic acids and phenols, thiophenols, and aminobenzenes(anilines) containing NO$_2$ and/or CN groups, particularly a nitrophenol, preferably 4-nitrophenol, are used for the synthesis of the polymers. However, derivatives with an F, $CH_3$, or $CF_3$ substituent can also be used. A series of compounds of this type (esters, thioesters, and amides) is the object of the simultaneously filed German Patent Application, File Number 195 32 138.3 "New Dicarboxylic Acid Derivatives" (GR 95 P 3618).

Derivatives of dicarboxylic acids, such as 1,3-benzenedicarboxylic acid (isophthalic acid) and diphenylether-4,4'-dicarboxylic acid (oxydibenzoic acid) are preferably used for the synthesis of the precursors. However, in general, those dicarboxylic acids that are used for the preparation of precursors of the above-mentioned type can be used.

Particularly suitable bis-o-aminophenols are 2,2-bis(3-amino-4-hydroxyphenyl)hexafluoropropane and 3,3'-dihydroxy-4,4'diaminodiphenyl. The corresponding bis-o-aminothiophenols are used for the synthesis of poly-o-mercaptoamides. In principle, however, all bis-o-aminophenols and -thiophenols that are customarily used for the preparation of polybenzoxazole and polybenzothiazole precursors can be used.

The reaction of the dicarboxylic acid derivative with the bis(thio)phenol takes place advantageously in the presence of a basic catalyst, which is preferably a tertiary amine. Catalysts of this type are, in particular, pyridine, triethylamine, diazabicyclooctane, and polyvinylpyridine. However, other basic catalysts can also be used, in which case preference is given to those that are readily soluble in the solvent used in the synthesis of the precursor, such as N-methylpyrrolidone, or are readily soluble in water or water/alcohol mixtures (precipitants), or those that are completely insoluble, such as cross-linked polyvinylpyridine.

The reaction temperature in the reaction between the dicarboxylic acid derivative and the (thio)phenol is preferably between 20 and 150° C. It has proved advantageous for the reaction selectivity to increase the temperature gradually.

The process according to the invention is therefore carried out advantageously by dissolving the dicarboxylic acid derivative, the bis-o-aminophenol or -thiophenol, and a basic catalyst at room temperature, optionally at elevated temperature, in an organic solvent and then gradually heating the reaction mixture. After the end of the reaction, the reaction solution is permitted to cool to room temperature and the reaction product is then precipitated with a suitable precipitant. After filtration and drying, the precipitated polymer is ready for use. The process according to the invention thus eliminates cumbersome purification steps, such as the purification of the polymer by means of an ion exchanger.

N-Methylpyrrolidone, tetrahydrofuran, and N,N-dimethylacetamide are suitable solvents. In principle, however, one can use any solvent in which the starting components are readily soluble. Particularly suitable precipitants are water and mixtures of water with alcohols, such as ethanol and isopropanol.

In the process according to the invention—in the presence of an excess of bis-o-aminophenol or -thiophenol—the amino end groups of the poly-o-hydroxyamide or -mercaptoamide produced can be capped. i.e., blocked, with a dicarboxylic acid anhydride before precipitation of the polymer. Cis-5-norbornene-endo-2,3-dicarboxylic acid anhydride is particularly suitable for this purpose.

The invention will be explained in greater detail by means of exemplifying embodiments.

EXAMPLE 1
Preparation of a PBO Precursor

The following are placed in a 250-ml three-necked flask under nitrogen (as a protective gas): 14.0 g of a diester of isophthalic acid and 4-nitrophenol, 13.94 g of 2,2-bis(3-amino-4-hydroxyphenyl)hexafluoropropane, 5.43 g of pyridine, and 185 ml of dry N-methylpyrrolidone. This mixture is then stirred for 16 hrs at room temperature and then for 24 hrs at 100° C. and 72 hrs at 120° C. After cooling to room temperature, 0.57 g of cis-5-norbornene-endo-2,3-dicarboxylic acid anhydride, dissolved in 3 ml of N-methylpyrrolidone, is added to block the end groups and the reaction solution is then stirred for another 14 hrs at room temperature. The red-brown reaction solution is then added dropwise, with vigorous stirring, to a tenfold quantity of a mixture of three parts by volume of water and one part by volume of isopropanol (as precipitant). The precipitated polymer is filtered off, washed four times with 200-ml portions of precipitant, treated with 1000 ml of precipitant, and stirred for 16 hrs. The polymer is then filtered off and dried first for 24 hrs at approx. 20 mbar and then for eight days at approx. 2 mbar, in each case at 50° C. The yield is 11.5 g.

EXAMPLE 2
Solubility of the PBO Precursor 1 g of the PBO precursor prepared according to Example 1 is dissolved in 3 g of N-methylpyrrolidone and the solution is placed in a plastic syringe equipped with a preliminary filter. The polymer solution is then applied by means of the syringe to a purified and dried silicon wafer and this is centrifuged in a centrifuge apparatus (Convac, type ST 146). The film formed on the wafer is dried at 120° C. on a hot plate. After cooling, the wafer coated with the polymer film is immersed in a commercially available aqueous alkaline developer free of metal ions (NSD-TD, Tokyo-Ohka). During this process, the polymer film dissolves uniformly, i.e, without cracking and without flaking off. After only a short time, the whole polymer film is completely dissolved in the developer. The same result is obtained if, instead of the above-mentioned developer, a 3% solution of tetramethylammonium hydroxide in distilled water is used.

EXAMPLE 3
Photostructuring of the PBO Precursor 0.8 g of the PBO precursor prepared according to Example 1 and 0.2 g of a diester from naphthoquinonediazide-4-sulfonic acid and bisphenol-A (as a photoactive component) are dissolved in 3 g of N-methylpyrrolidone. The resist solution obtained by this process is then applied to a silicon wafer and dried according to Example 2. One-half of the wafer is then covered with an aluminum foil and the other half is irradiated with a mercury/xenon lamp. The wafer is then immersed in a commercial developer solution according to Example 2. It is found that only the exposed regions are dissolved out selectively and uniformly (positive resist).

EXAMPLE 4
Preparation of a PBO Precursor

The following are placed in a 250-ml three-necked flask under nitrogen (as a protective gas): 10.0 g of a diester of diphenylether-4,4'-dicarboxylic acid and 4-nitrophenol, 7.73 g of 2,2-bis(3-amino-4-hydroxyphenyl)hexafluoropropane, 3.85 g of triethylamine, and 120 ml of dry N-methylpyrrolidone. This mixture is then stirred for 16 hrs at room temperature and then for 72 hrs at 80° C. and 24 hrs at 90° C. After cooling to room temperature, 0.32 g of cis-5-norbornene-endo-2,3-dicarboxylic acid anhydride, dissolved in 2 ml of N-methylpyrrolidone, is added to block the end groups and the reaction solution is then stirred for another 14 hrs at room temperature. The light-brown reaction solution is then added dropwise, with vigorous stirring, to a tenfold quantity of a mixture of three parts by volume of water and one part by volume of isopropanol (as a precipitant). The precipitated polymer is filtered off, washed four times with 200-ml portions of precipitant, treated with 1000 ml of precipitant and then stirred for 16 hrs. The polymer is then filtered off and dried first for 24 hrs at approx. 20 mbar and then for eight days at approx. 2 mbar, in each case at 50° C. The yield is 10.2 g.

EXAMPLE 5

Solubility of the PBO Precursor

If the procedure of Example 2 is used with the PBO precursor prepared according to Example 4, using diethylene glycol diethyl ether as a solvent, then the same result is obtained, i.e., the PBO precursor dissolves uniformly in both aqueous alkaline developers free of metal ions.

EXAMPLE 6

Photostructuring of the PBO Precursor

If the same procedure as in Example 3 is used with the PBO precursor prepared according to Example 4, using diethylene glycol diethyl ether as a solvent, then the same result is obtained, i.e, only the exposed regions are dissolved out selectively and uniformly.

What is claimed is:

1. A process for the preparation of poly-o-hydroxyamides and poly-o-mercaptoamides, comprising reacting a bis-o-aminophenol or a bis-o-amino-thiophenol with a dicarboxylic acid derivative of the following structure:

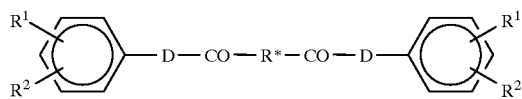

wherein D is O, S, or NH;

$R^1$ and $R^2$ are, independently of each other, H, F, $CH_3$, $CF_3$, CN, or $NO_2$, wherein at least one of the groups $R^1$ and $R^2$ is CN or $NO_2$; and R* is:

—$(CR_2)_m$, wherein R=H, F, $CH_3$, or $CF_3$ and m is 1 to 10;

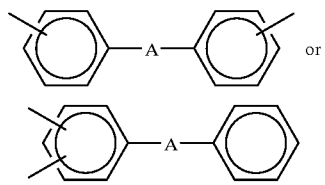

wherein A is $(CH_2)_n$, $(CF_2)_p$, $C(CH_3)_2$, $C(CF_3)_2$, $C(CH_3)(C_6H_5)$, $C(CF_3)(C_6H_5)$, $C(CF_3)(C_6F_5)$, $C(C_6H_5)_2$, $CF_2$—CF($CF_3$), CH=CH, CF=CF, C≡C, O—$C_6H_4$—O, O, S, CO, or $SO_2$, wherein n is 0 to 10 and p is 1 to 10;

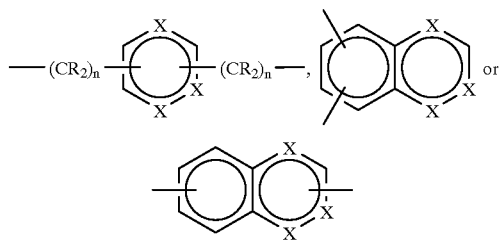

wherein X is CH [or N], R is H, F, $CH_3$, or $CF_3$, and n is 0 to 10 ; and wherein, in each case, all hydrogen atoms (H) in aromatic partial structures can be replaced by flourine [;

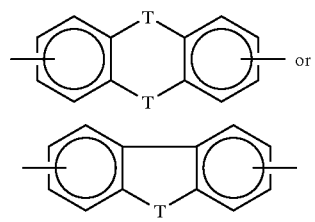

wherein T is $CH_2$, $CF_2$, CO, O, S, NH, or $N(CH_3)$;

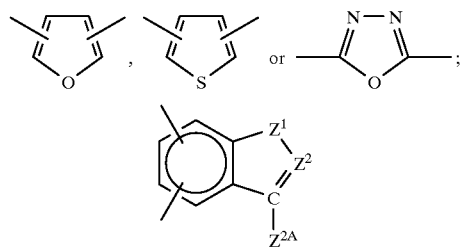

wherein $Z^1$=$CH_2$ or $CH(CH_3)$ and $Z^2$=CH or $C(CH_3)$
$Z^1$ is $CH_2$ or $CH(CH_3)$ and $Z^2$=N
$Z^1$ NH or $N(CH_3$ and $Z^2$=CH or $C(CH_3)$
$Z^1$ NH or $N(CH_3)$ and $Z^2$=N
$Z^{2A}$ is H or $CH_3$;

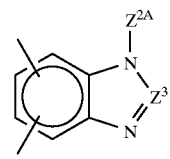

wherein $Z^3$ is CH, $C(CH_3)$, or N;

wherein $Z^4$ is O or S;
and wherein, in each case, all hydrogen atoms (H) in aromatic partial structures can be replaced by fluorine (F)].

2. The process of claim 1, wherein said dicarboxylic acid ester contains a nitrophenol group.